United States Patent
Schmit et al.

(10) Patent No.: US 9,559,038 B2
(45) Date of Patent: Jan. 31, 2017

(54) PACKAGE FOR A SEMICONDUCTOR DEVICE

(71) Applicant: Deere & Company, Moline, IL (US)

(72) Inventors: Christopher J. Schmit, Fargo, ND (US); Eric M. Johnson, Geneseo, IL (US)

(73) Assignee: DEERE & COMPANY, Moline, IL (US)

( * ) Notice: Subject to any disclaimer, the term of this patent is extended or adjusted under 35 U.S.C. 154(b) by 97 days.

(21) Appl. No.: 14/700,601

(22) Filed: Apr. 30, 2015

(65) Prior Publication Data

US 2016/0322279 A1 Nov. 3, 2016

(51) Int. Cl.
| | | |
|---|---|---|
| *H01L 23/34* | (2006.01) | |
| *H05K 7/20* | (2006.01) | |
| *H01L 23/473* | (2006.01) | |
| *H01L 23/043* | (2006.01) | |
| *H01L 23/10* | (2006.01) | |
| *H01L 23/367* | (2006.01) | |
| *H01L 23/00* | (2006.01) | |

(52) U.S. Cl.
CPC ........... *H01L 23/473* (2013.01); *H01L 23/043* (2013.01); *H01L 23/10* (2013.01); *H01L 23/3675* (2013.01); *H01L 23/564* (2013.01)

(58) Field of Classification Search
CPC ...... H01L 23/473; H01L 23/043; H01L 23/10; H01L 23/3675; H01L 23/564
USPC .......................................... 257/714; 361/699
See application file for complete search history.

(56) References Cited

U.S. PATENT DOCUMENTS

| | | | | |
|---|---|---|---|---|
| 3,328,642 A | * | 6/1967 | Haumesser | C09K 5/06 165/185 |
| 4,103,318 A | * | 7/1978 | Schwede | H05K 7/20854 361/707 |
| 4,694,119 A | * | 9/1987 | Groenewegen | G11B 33/142 169/48 |
| 7,710,723 B2 | * | 5/2010 | Korich | H05K 7/20927 165/104.33 |
| 7,969,735 B2 | * | 6/2011 | Nakatsu | H02M 7/003 165/104.33 |
| 8,059,404 B2 | * | 11/2011 | Miller | H02M 7/003 165/104.33 |
| 8,342,276 B2 | | 1/2013 | Murakami | |

(Continued)

OTHER PUBLICATIONS

ShowerPower Cooling Concept. Danfoss Silicon Power GmbH, 2014. [Product brochure] [online]. [Retrieved May 27, 2015]. Retrieved from the Internet <URL: http://danfoss.ipapercms.dk/Drives/DD/Global/SalesPromotion/Silicon/Brochures/UK/ShowerPowerAN/>.

*Primary Examiner* — Luan C Thai

(57) ABSTRACT

A package for a semiconductor device or circuit comprises a semiconductor switch module having a metallic base on an exterior side and metallic pads. A metallic enclosure is arranged for receiving the semiconductor switch module. The metallic enclosure has a recess of a size and shape for receiving the semiconductor switch module. The metallic enclosure has a set of dielectric regions with embedded or pass-through electrical terminals that are electrically insulated or isolated from the metallic enclosure. The electrical terminals are electrically connected to the metallic pads. A metallic bridging connection fills and hydraulically seals what would otherwise be a perimeter gap between the metallic base and the metallic enclosure.

15 Claims, 7 Drawing Sheets

(56) References Cited

U.S. PATENT DOCUMENTS

| | | |
|---|---|---|
| 8,519,532 B2 | 8/2013 | Lenniger et al. |
| 2010/0052157 A1 | 3/2010 | Pratt |
| 2013/0170171 A1 | 7/2013 | Wicker et al. |

* cited by examiner

PACKAGE FOR A SEMICONDUCTOR DEVICE

FIELD OF THE DISCLOSURE

This disclosure relates to a package for a semiconductor device, such as a semiconductor switch module.

BACKGROUND ART

For some semiconductor devices, certain prior art semiconductor packages are available for soldering to a cold plate or connection to a cold plate via a thermal interface material. If thermal interface material is used rather than a direct metal bonding or solder connection, thermal impedance for the system of the semiconductor package and the cold plate tends to be increased; hence, heat dissipation of a semiconductor device can be degraded.

To reduce or minimize thermal impedance, other prior art semiconductor devices support applying coolant directly to semiconductor packages via coolant volumes that are bounded by gaskets or seals. However, if the seals or gaskets leak, an electronic assembly associated with the semiconductor device or the semiconductor device can become vulnerable to catastrophic failure, such as short circuits associated with water or moisture, from the ingress of coolant into live electronic circuitry and devices. Therefore, there is need for a package for a semiconductor device that facilitates the use of coolants without a gasket or seal that is vulnerable to the leakage of coolant or ingress of coolant into semiconductor device.

SUMMARY

In accordance with one embodiment, a package for a semiconductor device or circuit comprises a semiconductor switch module having a metallic base on an exterior side and metallic pads. A metallic enclosure is arranged for receiving the semiconductor switch module. The metallic enclosure has a recess of a size and shape for receiving the semiconductor switch module. The metallic enclosure has a set of dielectric regions for embedded or pass-through electrical terminals that are electrically insulated or isolated from the metallic enclosure. The electrical terminals are electrically connected to the metallic pads. A metallic bridging connection fills and hydraulically seals (e.g., or hermetically seals) what would otherwise be a perimeter gap between the metallic base and the metallic enclosure.

BRIEF DESCRIPTION OF THE DRAWINGS

Like reference numbers in any set or subset of the drawings indicate like elements or features.

DETAILED DESCRIPTION OF EMBODIMENTS

Figure 1:
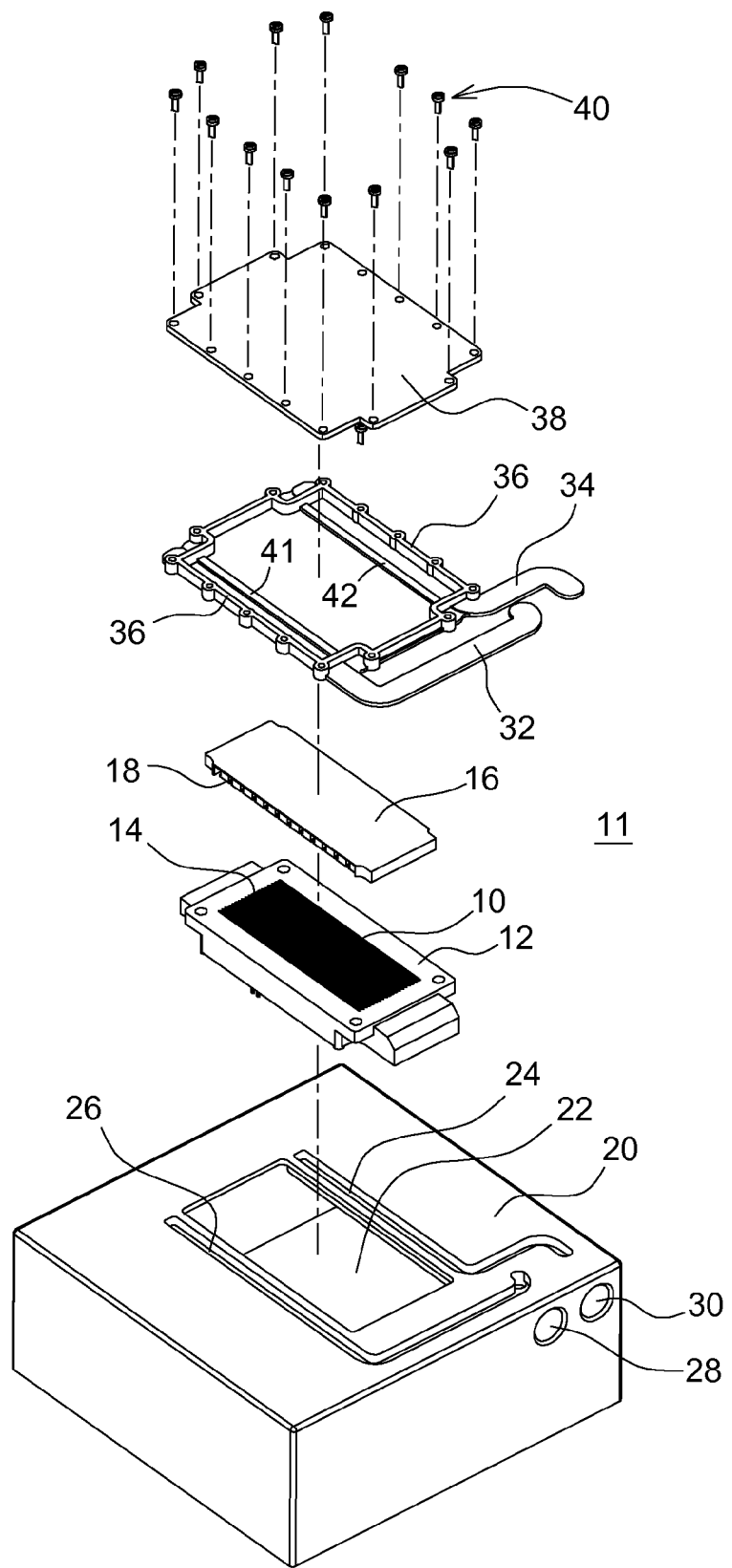
FIG. 1 is one embodiment of a an exploded perspective view of a package for semiconductor device or circuit.

In accordance with one embodiment, FIG. 1 through FIG. 5, inclusive, illustrate a package 11 for a semiconductor device or circuit. The package 11 comprises a semiconductor switch module 12 that comprises a semiconductor die 17 or semiconductor device package. The semiconductor switch module 12 or semiconductor die 17 has a metallic base 10 on an exterior side. The semiconductor die 17 can have metallic pads (57 in FIG. 5) in the semiconductor switch module 12. A metallic enclosure (61 in FIG. 5) is arranged for receiving the semiconductor die 17 to form the semiconductor switch module 12. The metallic enclosure 61 has a recess 67 of a size and shape for receiving the semiconductor die 17 to form a semiconductor switch module 12. The metallic enclosure 61 has a set of dielectric regions 65 with embedded or pass-through electrical terminals 50 that are electrically insulated or isolated from the metallic enclosure 61. The electrical terminals 50 (in FIG. 5) are electrically connected to the metallic pads 57. A metallic bridging connection 14 fills and hydraulically (e.g., or hermetically) seals what would otherwise be a perimeter gap between the metallic base 10 and the metallic enclosure 61.

In one embodiment, a sealed metallic enclosure 53 is defined by the combination of metallic enclosure 61, metallic bridging connection 14, metallic base 10, collectively, or its or their equivalent. For example, the sealed metallic enclosure 53 comprises a base 63 with side walls 69 extending upward from the base 63 a top 14 hermetically connected or hydraulically sealed to the side walls 69 and the metallic base portion 10. The sealed metallic enclosure 53 may be hermetically sealed, hydraulically sealed, or both to resist or prevent the ingress of fluids, liquids or coolant at the operational pressures associated with the chamber 43.

The sealed metallic enclosure 53 holds the semiconductor switch module 12. The metallic enclosure 53 has a set of dielectric regions 65 with embedded or pass-through electrical terminals 50 that are electrically insulated or isolated from the sealed metallic enclosure 53. The electrical terminals 50 are electrically connected to the metallic pads 57. A housing 20 (e.g., lower housing) is adapted for housing the semiconductor switch module 12 within the sealed metallic enclosure 53. The housing 20 comprises chamber 43 for holding or circulating a coolant overlying the metallic base 10.

A semiconductor switch module 12 may comprise one or more semiconductor switches or fabricated circuits on a semiconductor die 17. In one example, the semiconductor switch module 12 may comprise a power switches for one phase of an inverter for controlling an electric motor or an electric machine in a motoring mode, a power generation mode, or both. Further, the semiconductor switch module 12 may comprise a high-side semiconductor switch and a low-side semiconductor switch with their switched terminals available for coupling to the a direct power supply or bus. The semiconductor switches may comprise insulated-gate, bipolar-junction transistors (IGBTs), transistors, field-effect transistors (FETs), or other semiconductor devices.

The switched terminals of an IGBT comprise a collector and an emitter, and the control terminal comprises a gate; the control terminal of some transistors may be referred to as a base. Analogously, the switched terminals of a field effect transistor comprise drain and source, and the control terminals comprise a gate.

Figure 5:
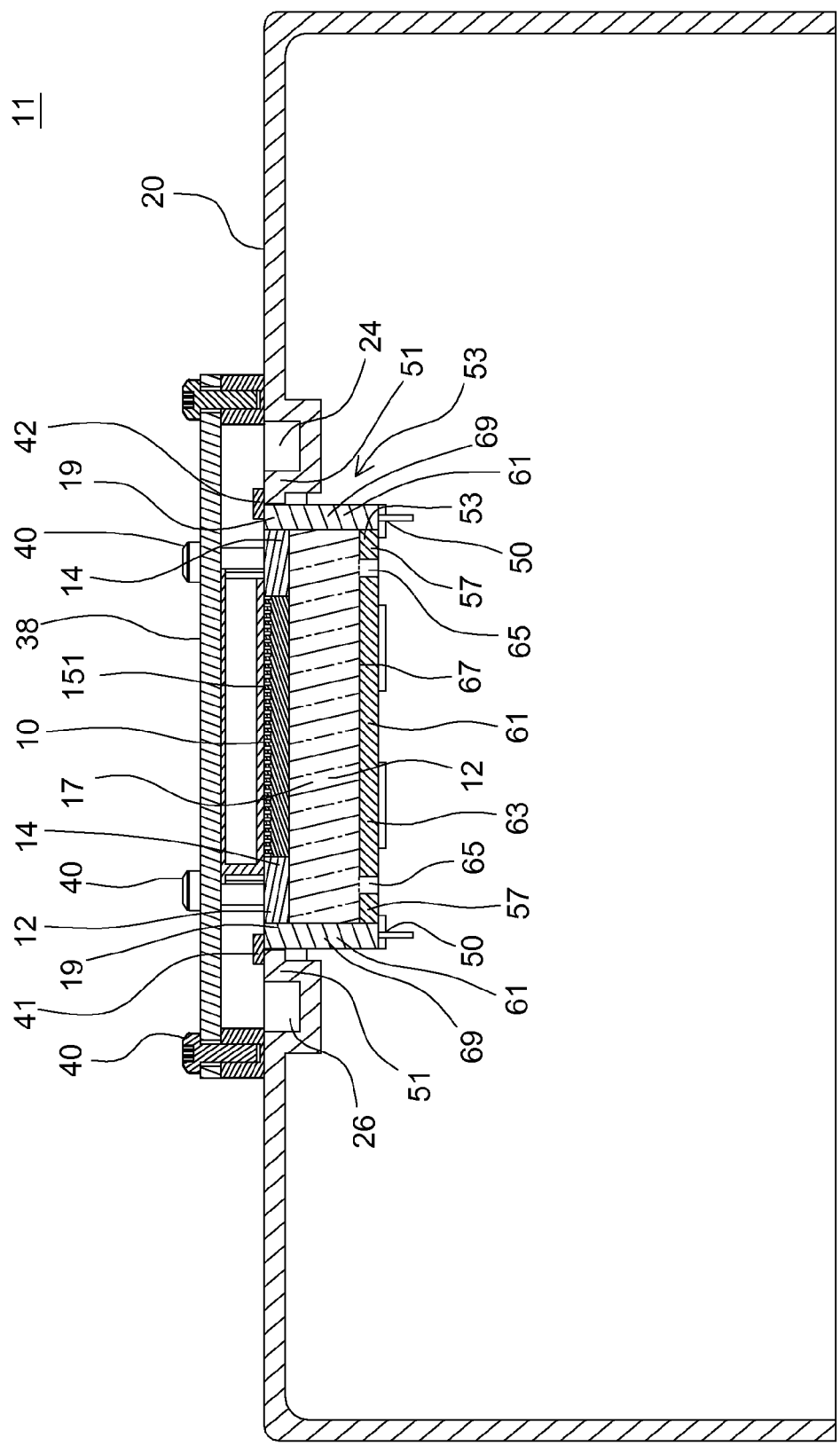
FIG. 5 is a cross-sectional view of the package of the semiconductor device or circuit of FIG. 4 as viewed along reference line 5-5 of FIG. 4.

In one embodiment, base grooves or channels 151 (e.g., micro-grooves) are etched or formed into or on the metallic base 10 of the semiconductor switch module 12 or the underlying semiconductor die 17. For example the base grooves 151 or channels are substantially parallel as illustrated in FIG. 5. In certain configurations, the dimensions (e.g., depth, width, radial depth, or maximum dimension) of the base grooves 151 are sufficiently small, which can be referred to as micro-channels, that allow the metallic base 10 to be cooled directly by a coolant or liquid or mounted on cold-plate or heat sink via thermal grease (e.g., highly thermally conductive grease) or suitable thermal interface material.

The metallic base 10 comprises pad or paddle (e.g., central pad) of the semiconductor package 11, such as a standard semiconductor switch package. In certain configurations, the metallic base 10 may be composed of copper or a copper alloy, although any other suitable metals or alloys may be used. If the copper or copper alloy is used for the metallic base 10, the copper or copper alloy can be joined, fused, sintered, brazed or welded to the metallic container 61 or shell, even if the metallic container 61 is composed of aluminum or an aluminum alloy.

In one embodiment, the metallic pads 57 are on an interior side opposite the exterior side of the semiconductor switch module 12. However, in an alternative embodiment, the metallic pads 57 can be located on the sides or elsewhere on the semiconductor switch module 12. The metallic pads 57 provides connections to the direct current terminals, switched terminals or control terminals of the semiconductor switch module 12.

In an alternative embodiment, the metallic pads 57 may be replaced by bonding wires to the semiconductor devices, regions or terminals of the semiconductor die 17.

In one configuration, the metallic enclosure 61 comprises a shell (e.g., precast shell or preformed shell). For example, the metallic enclosure 61 comprises a base 63 with side walls 69 extending upward from the base 63. The metallic bridging connection 14 fills and seals (e.g., hydraulically seals, hermetically seals, or both) a perimeter gap between the metallic base 10 and a top portion of the side walls 69 against the ingress of coolant or liquid into the interior of the sealed enclosure 53 where the semiconductor switch module 12 resides. For example, the metallic bridging connection 14 or bridging material can be bonded, fused, sintered, brazed, soldered or welded between the metallic base 10 and the top portion of the side walls 69. The metallic bridging connection 14 comprises a metallic ring, a metallic loop or substantially rectilinear outline of metallic material formed by an ultrasonic additive manufacturing process, a direct metal laser sintering process, selective laser melting, electron beam melting, or another additive metal manufacturing process.

Similarly, instead of chemically etching base grooves 151 or channels in the metallic base 10, base grooves 151 or channels may be formed by adding fins or ridges to the metallic base 10 by an ultrasonic additive manufacturing process, a direct metal laser sintering process, selective laser melting or another additive metal manufacturing process. In general, the thickness of the metallic base 10 can be kept lower for the additive metal manufacturing processes than for traditional mechanical machining processes.

An ultrasonic additive manufacturing process refers to creating solid metallic object by ultrasonic welding or fusing of successive layers of metal or an alloy (e.g., aluminum, copper, nickel, steel, or other metals or alloys) into a target size and shape. For example, ultrasonic additive manufacturing may use ultrasonic vibrations to bond one or more metallic layers (e.g., metallic tape) to form the metallic bridging connection 14 between the metallic base 10 and the top portion of the side walls 69.

A direct metal laser sintering process refers to a manufacturing process that uses a laser to sinter powdered metallic material by directing the laser to spatial points to bind the material together to create a solid structure in accordance with a three dimensional model. For example, the three dimensional model can be consistent with the formation of the metallic bridging connection 14 between the metallic base 10 and the top portion of the side walls 69.

Selective laser melting is similar to direct metal laser sintering. However, in selective laser melting process the material is completely melted or fused.

In certain configurations, the metallic enclosure 61 is composed of aluminum, an aluminum alloy, copper, a copper alloy, a metal, or an alloy, or multiple different layers of metals or alloys. The metal or alloy of the metallic enclosure is selected to be compatible with bonding to the metallic base 10 of the semiconductor device. For example, the metallic base 10 may be composed of copper, a copper alloy, aluminum, an aluminum, an alloy, or metal.

A lower housing 20 has a central opening 22 (in FIG. 1) for receiving an assembly comprising the semiconductor switch module 12, the metallic enclosure 61 and the metallic bridging connection 14. The lower housing 20 comprises a first perimeter channel 24 in communication with a first port 30, a second perimeter channel 26 in communication with a second port 28, and a set of channel caps (32, 34) for covering the first perimeter channel 24 and the second perimeter channel 26.

The lower housing 20 can be composed of aluminum, an alloy or a metal, and may be selected to have a coefficient of thermal expansion that is matched or similar to that of the semiconductor switch module 12.

In an alternate embodiment, the lower housing 20 can be composed of a plastic, a polymer, a composite, a fiber-filled polymer, a fiber-filled plastic, or a filler bound by a resin, polymer or plastic matrix.

The set of channel caps (32, 34) comprises a path-following cover portion and side walls extending at an angle from the cover portion. In certain configurations, the channel caps (32, 34) only underlie an outer clamping region of the lid 38.

A lid 38 and seal framework 36, the seal framework 36 intervening between the lid 38 and at least a portion of the set of channel caps (32, 34).

A lid 38 and a seal framework 36 can be secured to the lower housing 20. As illustrated, the lid 38 is secured to the lower housing 20 member via a plurality of fasteners 40, although the lid 38 can be affixed to the housing via fasteners 40, adhesive, snap-fit connections, or other suitable connections. The seal framework 36 intervenes between the lid 38 and a portion of an upper surface of the lower housing 20. The seal framework 38 may be composed of a plastic, a polymer, a composite, a fiber-filled polymer, a fiber-filled plastic, a filler bound by a resin, polymer or plastic matrix, an elastomer, a resilient material, synthetic rubber, or natural rubber.

A coolant chamber 43 is defined between the semiconductor switch module 12 (e.g., metallic base 10), lid 38 and seal framework 36. The coolant chamber 43 is in communication with the first port 30 and the second port 28. The seal framework 36 comprises a seal, a gasket or another sealing member for hydraulically sealing a coolant chamber to prevent the egress of coolant from the coolant chamber 43 to an exterior.

In certain embodiments, the first port 30 and the second port 28 are connected to conduit for connection a radiator and a pump for circulation of a coolant. For example, the pump and the radiator are connected in series with conduit, where a pump the coupled to one port and the radiator is coupled to the other port.

In one embodiment, a center member 16 comprises a manifold that has a series of internal channels 18 or passageways for circulating coolant. A center member 16 is arranged for insertion into the chamber 43. The center member 16 and the flow of coolant will be described in greater detail later in this document.

The sealed metallic enclosure 53 is well-suited for housing the semiconductor switch module 12 isolated from coolant or fluid that may be used to directly cool the outside of the sealed metallic enclosure 53 or the metallic base 10, with or without base grooves 151. In some embodiments, the coolant is confined to, held in, or circulated within a chamber 43 such that the coolant or fluid can circulate in contact directly with the metallic base and the base grooves 151 to remove heat (e.g., with high thermal conductivities at the liquid boundary layer and with reduced thermal impedance of the package 11) from the semiconductor switch module 12 during its operation. Accordingly, the sealed metallic enclosure 53 does not require any gaskets or seals to isolate the semiconductor switch device 12 from the coolant, with the possible exception of the sealant, potting compound, elastomer or dielectric regions 65 associated with the reliably sealed (e.g., without seals, without gaskets, or both) exit of conductors or electric terminals 50 from the sealed metallic enclosure 53. Moreover, the coolant or liquid facilitates improved thermal dissipation from the semiconductor switch module 12, which means higher power capability for a given semiconductor switch module 12 for controlling larger electric devices or machines (e.g., electric motors) with greater usable torque at the output shaft.

Figure 2:
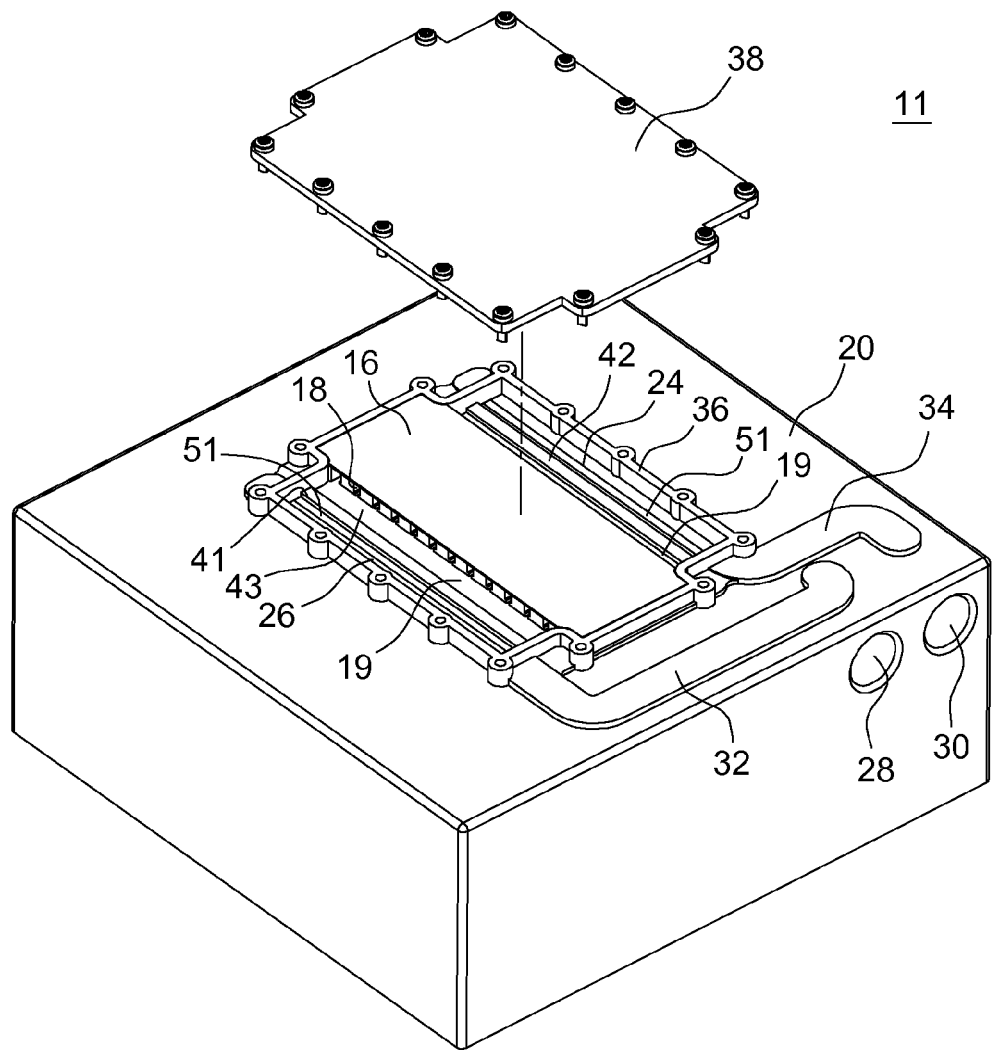
FIG. 2 is a perspective view of a package of the semiconductor device or circuit, which is consistent with FIG. 1, with a lid removed to expose a chamber for the coolant.

FIG. 2 is a perspective view of a package 11 of the semiconductor device or circuit, which is consistent with FIG. 1, with a lid 38 removed to expose a chamber 43 for the coolant. The first perimeter channel 24 and the second perimeter channel 26 are in hydraulic communication with the chamber 43. For example, as illustrated, each of first perimeter channel 24 and the second perimeter channel 26 is open or exposed along its length to the chamber 43 to allow fluid to circulate in the chamber 43 via the first port 30, the second port 28, or both. A first seal 41 seals between an outer perimeter or exterior surface 19 of the semiconductor switch module 12 and the upper surface 51 of the lower housing 20. Similarly, a second seal 42 seals between an outer perimeter or exterior surface 19 of the semiconductor module 12 and the upper surface 51 of the lower housing 20. Even if the first seal 41 or the second seal 42 were to leak or fail, coolant would not damage the semiconductor switch module 12, which is sealed from the ingress of coolant or fluid at the bridging connection 14. Of course temperature monitoring of the semiconductor switch module 12 or switching transistors can be used to shut down or disable one or more switching transistors or the semiconductor switch module 12 in the event of a failure or leakage of coolant reduces the heat dissipation of the semiconductor switch module 12.

Figure 3:
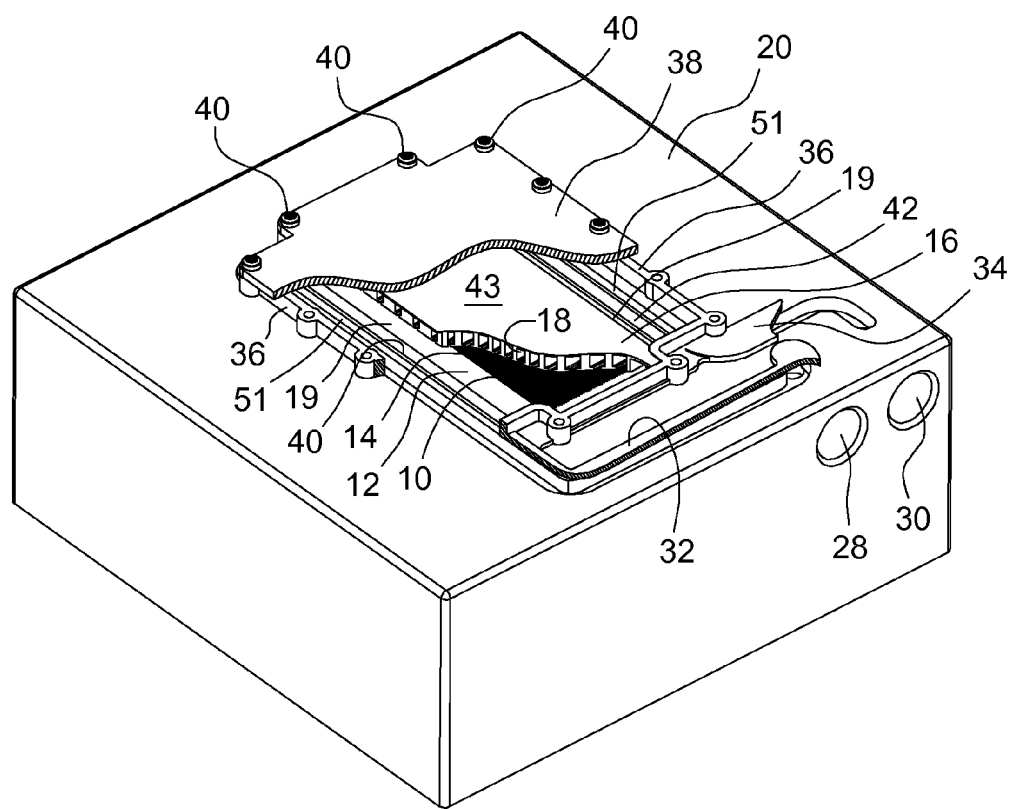
FIG. 3 is a perspective view of the package of the semiconductor device or circuit of FIG. 1 with the lid and center member (e.g., manifold) cut away to better reveal the semiconductor switch module.

FIG. 3 is a perspective view of the package of the semiconductor device or circuit of FIG. 1 with the lid 38 and center member 16 cut away to better reveal the semiconductor switch module 12 and chamber 43. The center member 16 comprises channels 18 in which the flow of coolant can be routed in alternating directions for adjacent channels 18.

Figure 4:
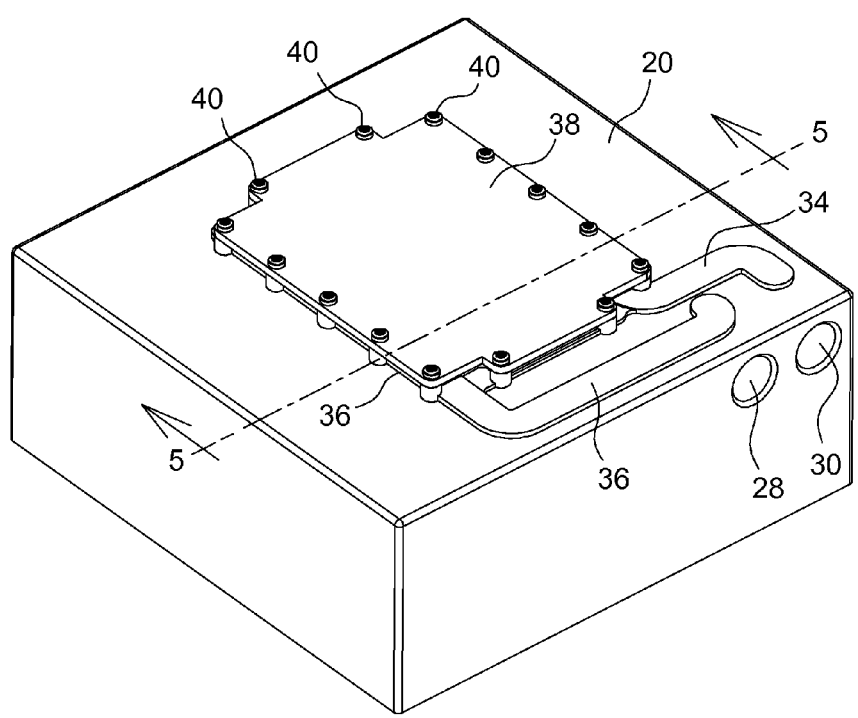
FIG. 4 is a perspective view of the package of the semiconductor device or circuit of FIG. 1, where the package is assembled.

FIG. 4 is a perspective view of the package 11 of the semiconductor device or circuit of FIG. 1, where the package 11 is assembled. The first port 30 and the second port 28 can be connected to a radiator in series with a pump via conduit to circulate fluid in the chamber 43.

FIG. 5 is a cross-sectional view of the package 11 of the semiconductor device 12 or circuit o FIG. 4 as viewed along reference line 5-5 of FIG. 4. FIG. 5 shows a cross section of the semiconductor device 12, which comprises a metallic enclosure 61 with a base 63 and side walls 69 to form recess 67 for receiving a semiconductor die 17. As illustrated, the semiconductor die 17 has conductive pads 57 that are electrically insulated or isolated from the metallic enclosure 61 and its base 63 via dielectric regions 65. In one embodiment, the dielectric regions 65 may be composed of an elastomer, adhesive, polymer (e.g. silicone), plastic or potting compound to prevent the ingress of fluid or coolant into the semiconductor device 12. The conductive pads 57 are mechanically and electrically connected to terminals 50 to provide electrical connections to terminals 50, such as direct current terminals, control terminals, or switched terminals of one or more semiconductor switches of the semiconductor switch module 12.

FIG. 5 illustrates a cross section of the bridging connection 14 that interconnects the side or edge of metallic base 10 to the edge or side walls 69 of the metallic enclosure 61. For clarity, the bridging connection 14 is shown as metallic material with an opposite cross hatch to the surrounding metallic enclosure 61, even though the bridging connection 14 is fused, welded, brazed, or soldered to the metallic enclosure 61 to the extent if any seam that is present or detectable, such seam is resistant to the hydraulic (e.g., or pneumatic) passage or hydraulic ingress of fluid or coolant. Further in certain configurations, even though the bridging connection 14 is fused, welded, brazed, or soldered to the metallic enclosure 61 to the extent if any seam that is present or detectable, such seam is resistant to the pneumatic passage, ingress or egress of gas or air between the interior and exterior of the semiconductor switch module 12.

Figure 6:
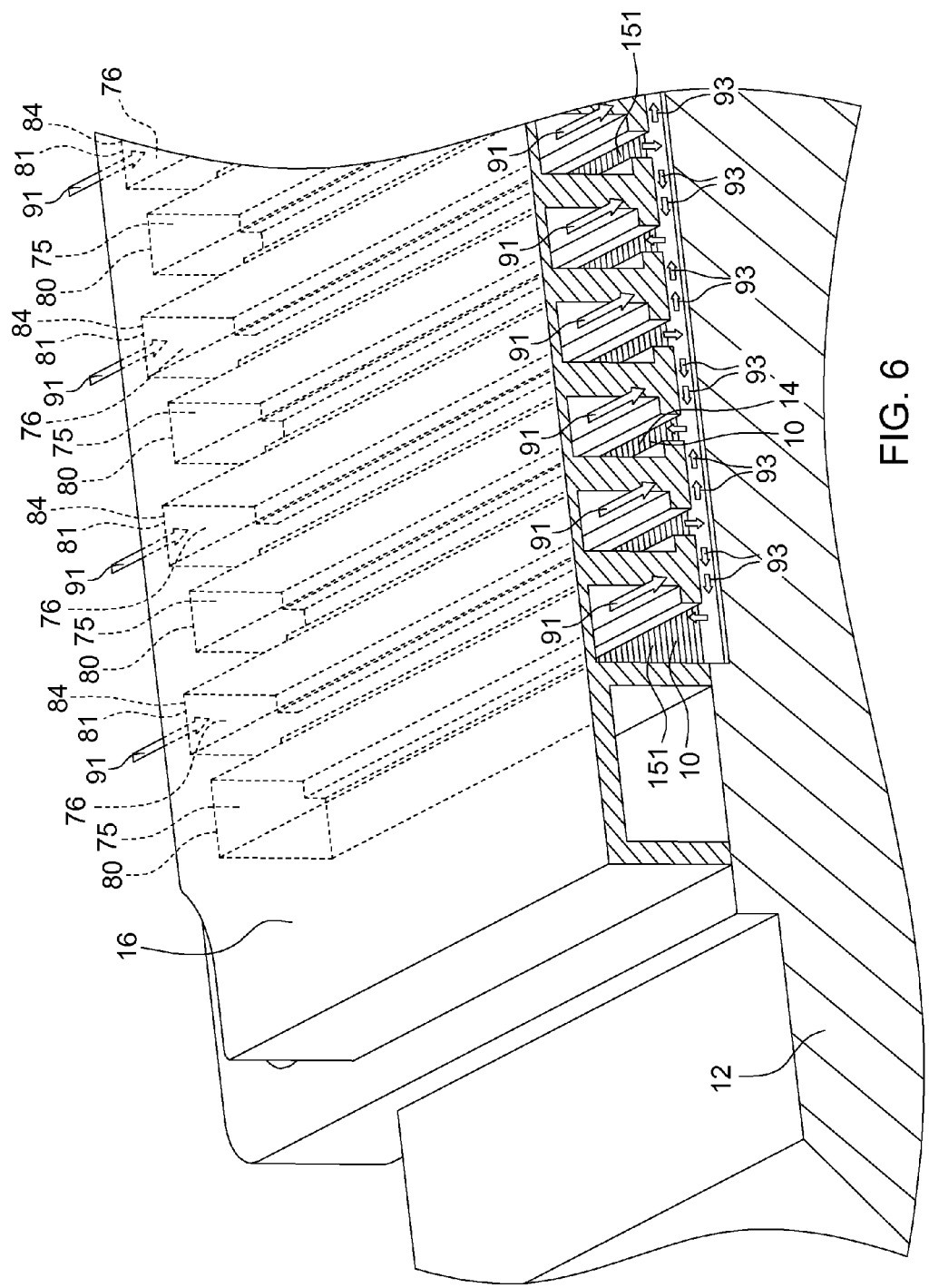
FIG. 6 is a cross-sectional view of the center member (e.g., manifold) and semiconductor switch module, which are shown separately from the remainder of the package.

FIG. 6 is a cross-sectional view of the center member 16 (e.g., manifold) and semiconductor switch module 12, which are shown separately from the remainder of the package 11. A center member 16 resides within the chamber 43. As illustrated, the center member 16 comprises a manifold with a series of generally parallel main channels (75, 76). Coolant can be circulated within or through the main channels (75, 76) in the center member 16 by a pump and a radiator coupled in series by conduit, pipe or tubing between the first port 30 and the second port 28. For example, the coolant can enter through inlets 81 (e.g., manifold inlets) to the main channels (75, 76) at one side of the center member 16 and exit at outlets 82 (e.g., manifold outlets) of the main channels (75, 76) at an opposite side. First, the coolant can be supplied to via the first port 30 and the first perimeter channel 24 to the inlets 81. Second, the coolant is circulated within the center member 16. Third, the coolant can exit the center member 16 via the outlets 82 where it flows to the second perimeter channel 26, and finally the second port 28.

In alternate embodiments, it will be appreciated that the above direction of flow can be reversed between the first port 30 and the second portion 28. In turn, the direction of flow can be reversed within the center member 16.

Figure 7:
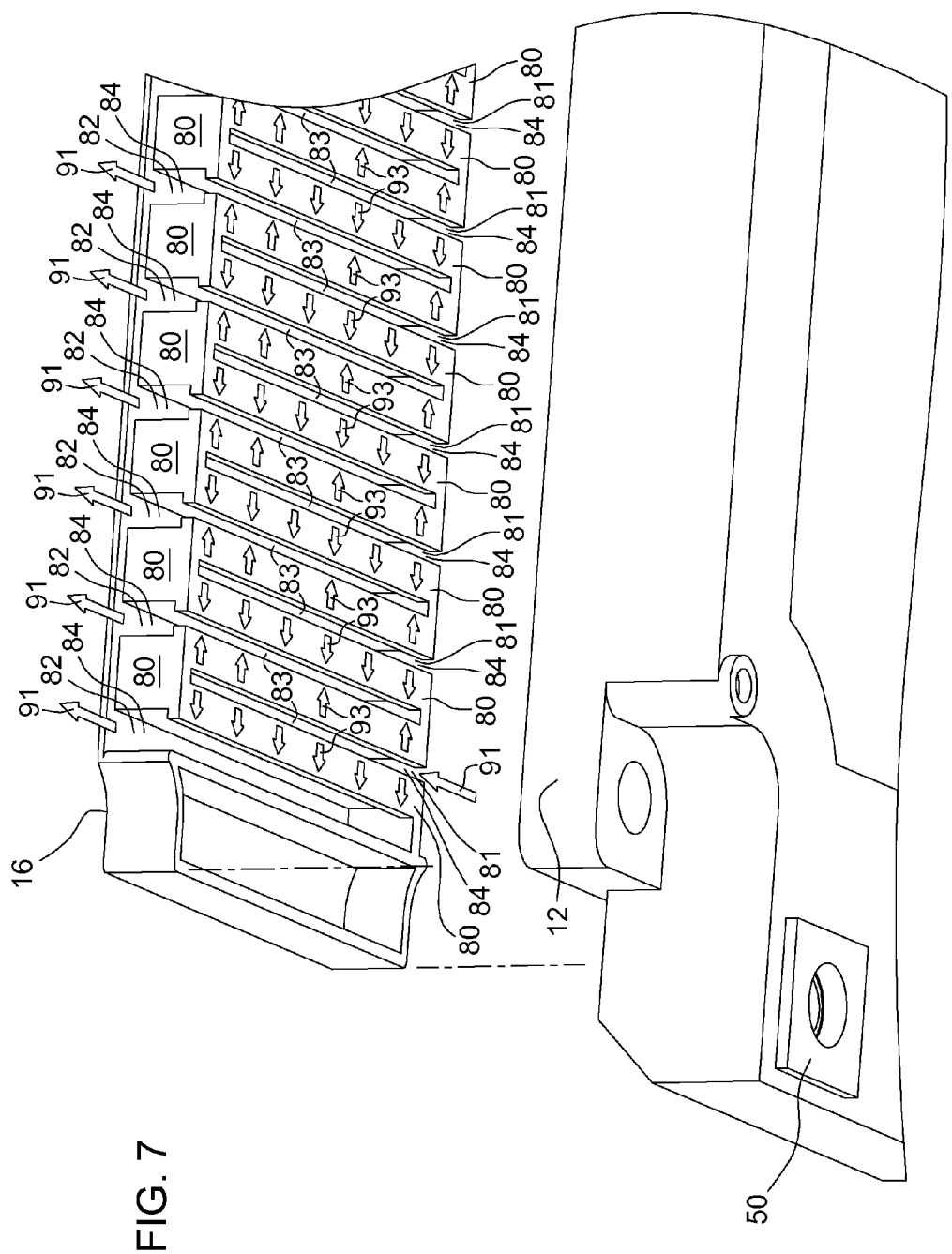
FIG. 7 shows an exploded view of the lower portions of the center member (e.g., manifold) and the semiconductor switch module of FIG. 6.

The internal channels 18 of FIG. 1 have been relabeled as main channels (75, 76) for FIG. 6 and FIG. 7 because the main channels (75, 76) are only illustrative examples of the internal channels 18 that can be used to carry out the package 11 for the semiconductor device. For example, in alternate embodiments, the internal channels 18 may comprise serpentine loops, circuitous loops, spirals passageways or other passageways, and such passageways or portions thereof may be open to or in hydraulic communication with the grooves 151 or exterior surface of the semiconductor switch module 12.

For purposes of the illustrative embodiment of FIG. 6 and FIG. 7, each main channel (75, 76) has an opening end 84 at one end of the channel (75, 76) and a terminating end 80 at an opposite end of the channel, opposite to the opening end 84. The terminating end 80 of the main channel (75, 76) directs or forces the coolant to flow in the base grooves 151 or channels of the semiconductor switch module 12. From inlets 81, which are associated with every other main channel (75, 76) of the center member 16, the coolant enters each inlet main channel 76 and is obstructed at the terminating end 80.

The coolant is directed to flow from or fed from the inlet main channels 76 to the base grooves 151 or channels, via slots 83, toward the outlet main channels 75. The base grooves 151 or channels may be referred to as secondary channels. As illustrated, the secondary flow 93 of the coolant within the base grooves 151 is generally in a substantially traverse or substantially orthogonal direction to the coolant flow in the main channels (inlet main channels 76 or outlet main channels 75) and away from main flow 91 in the inlet main channels 76. The main flow 91 in the outlet main channels 75 is toward the outlets 82. Larger arrows represent the general direction of main flow 91 in the main channel, whereas smaller arrows represent the general direction of bridging flow or secondary flow 92 in the base grooves 151.

As shown, the main channels (75, 76) have substantially rectangular cross sections with communicating slots 83, although other cross-sectional shapes of the channels are possible and fall within the scope of the appended claims. Each main channel (75, 76) has a respective slot 83 oriented longitudinally along its main channel or generally parallel to the main flow 91. The center member 16 has outlet main channels 75 and inlet main channels 76, wherein the inlet main channels 76 can feed coolant to the outlet main channels 75 via the slots 83 and base grooves 151 or channels of the semiconductor switch module 12.

The center member 16 or manifold may be composed of a metal, an alloy, a polymer, a composite, a fiber-filled polymer, a fiber-filled plastic, or a filler bound by a resin, polymer or plastic matrix.

FIG. 7 shows an exploded view of the lower portions of the center member 16 (e.g., manifold) and the semiconductor switch module 12 of FIG. 6. Like reference numbers in FIG. 6 and FIG. 7 indicate like elements. FIG. 7 provides additional arrows related to illustrative flow of coolant within the center member 16 or manifold and via adjoining or nearby grooves or channels of the semiconductor switch module 12.

Having described on or more embodiments, it will become apparent that various modifications can be made without departing from the scope of the invention as defined in the accompanying claims. Further embodiments of the invention may include any combination of features from one or more dependent claims, and such features may be incorporated, collectively or separately, into any independent claim.

The following is claimed:

1. A package for a semiconductor device or circuit, the package comprising:
   a semiconductor switch module having a metallic base on an exterior side and metallic pads;
   a metallic enclosure is arranged for receiving the semiconductor switch module, the metallic enclosure having a recess of a size and shape for receiving the semiconductor switch module, the metallic enclosure having a set of dielectric regions with embedded or pass-through electrical terminals that are electrically insulated or isolated from the metallic enclosure, the electrical terminals being electrically connected to the metallic pads; and
   a metallic bridging connection fills and hydraulically seals what would otherwise be a perimeter gap between the metallic base and the metallic enclosure.

2. The package according to claim 1 wherein the metallic base comprises a plurality of grooves or channels.

3. The package according to claim 2 wherein the grooves or channels are substantially parallel.

4. The package according to claim 1 wherein the metallic pads are on an interior side opposite the exterior side of the semiconductor switch module.

5. The package according to claim 1 wherein the metallic enclosure comprises a base with side walls extending upward from the base.

6. The package according to claim 1 wherein the metallic bridging connection or metallic material fills and hydraulically seals a perimeter gap that would otherwise exist between the metallic base and a top portion of the side walls, the metallic bridging connection bonded, sintered, fused or welded between the metallic base and the top portion of the side walls.

7. The package according to claim 1 wherein the metallic bridging connection comprises a metallic ring, a metallic loop or substantially rectilinear outline of metallic material formed by an ultrasonic additive manufacturing process, a direct metal laser sintering process or another additive metal manufacturing process.

8. The package according to claim 1 further comprising a lower housing having a central opening for receiving an assembly comprising the semiconductor switch module, the metallic enclosure and the metallic bridging connection.

9. The package according to claim 8 wherein the lower housing comprises a first perimeter channel in communication with a first port, a second perimeter channel in communication with a second port, and a set of channel caps for covering at least a portion of the first perimeter channel and the second perimeter channel.

10. The package according to claim 9 wherein the set of channel caps comprises a path-following cover portion and side walls extending at an angle from the cover portion.

11. The package according to claim 9 further comprising a lid and seal framework, the seal framework intervening between the lid and at least a portion of the set of channel caps.

12. The package according to claim 8 further comprising a lid and a seal framework secured to the lower housing.

13. The package according to claim 12 wherein the seal framework intervenes between the lid and a portion of an upper surface of the lower housing and wherein coolant chamber is defined between the metallic base, lid and seal framework.

14. The package according to claim 13 wherein the coolant chamber is in communication with the first port and the second port.

15. The package according to claim 12 wherein a central member has a series of internal channels or passageways for circulating coolant.

* * * * *